United States Patent
Nair et al.

(10) Patent No.: US 6,594,478 B1
(45) Date of Patent: Jul. 15, 2003

(54) SELF OSCILLATING MIXER

(75) Inventors: Vijay Nair, Mesa, AZ (US); Nada El Zein, Phoenix, AZ (US); Herbert Goronkin, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 477 days.

(21) Appl. No.: 09/706,443

(22) Filed: Nov. 3, 2000

(51) Int. Cl.[7] .................................................. H04B 1/28
(52) U.S. Cl. ........................ 455/333; 455/313; 455/323; 327/358
(58) Field of Search ..................... 455/323, 313, 455/321, 333, 318, 325, 326; 327/355, 356, 113, 358

(56) References Cited

U.S. PATENT DOCUMENTS

| | | | | |
|---|---|---|---|---|
| 3,624,514 A | * | 11/1971 | Putzer | 455/333 |
| 3,652,953 A | * | 3/1972 | Victoreen | 327/113 |
| 3,970,774 A | * | 7/1976 | Bazin et al. | 327/356 |
| 4,160,953 A | * | 7/1979 | Matsuura et al. | 455/333 |
| 4,219,779 A | * | 8/1980 | Shinkawa et al. | 455/321 |
| 4,242,634 A | * | 12/1980 | Metcalf | 327/356 |
| 4,249,262 A | * | 2/1981 | Fenk | 455/333 |
| 4,573,213 A | * | 2/1986 | Dixon et al. | 455/323 |
| 4,658,440 A | * | 4/1987 | Pavio et al. | 455/325 |
| 4,688,005 A | * | 8/1987 | Kipnis | 455/318 |
| 4,695,940 A | * | 9/1987 | Rein | 327/113 |
| 4,814,649 A | * | 3/1989 | Young | 327/113 |
| 5,280,290 A | * | 1/1994 | Evans | 455/321 |
| 5,465,418 A | * | 11/1995 | Zhou et al. | 455/323 |
| 5,557,228 A | * | 9/1996 | Liu | 327/355 |
| 5,570,056 A | * | 10/1996 | Groe | 327/358 |
| 5,606,738 A | * | 2/1997 | Onodera et al. | 327/358 |
| 6,218,881 B1 | * | 4/2001 | Hiraga | 327/358 |

* cited by examiner

*Primary Examiner*—Edward F. Urban
*Assistant Examiner*—Lana Le
(74) *Attorney, Agent, or Firm*—William E. Koch

(57) ABSTRACT

A self oscillating mixer circuit includes a dual gate FET, an NDR device coupled to a first gate of the FET, and a first bias input circuit adapted to couple a first bias voltage across the NDR device. The first bias voltage controls operation of the NDR device within an NDR region of the V-I characteristic curve of the NDR device so that oscillations occur in the NDR device and the FET. The first bias input circuit is adjustable to adjust the applied first bias voltage so as to control frequency and amplitude of the oscillations. An RF input terminal and a second bias input circuit are coupled to supply a second bias voltage at the other gate terminal, which biases the FET at maximum gain so that RF signals applied to the RF input terminal are mixed with the oscillations.

18 Claims, 1 Drawing Sheet

SELF OSCILLATING MIXER

FIELD OF THE INVENTION

This invention relates to mixer circuits for use in communications devices and the like.

More particularly, the present invention relates to an improved and greatly simplified mixer circuit which is useful, for example, in converting input radio frequency signals into intermediate frequency signals.

BACKGROUND OF THE INVENTION

Generally, communications devices, such as radios, wireless telephones, televisions, etc. incorporate a front end that receives transmitted radio frequency (RF) signals and converts the RF signals into intermediate frequency (IF) signals that are lower in frequency and, thus, easier to work with. Generally the front end includes some amplification of the received RF signals, after which the RF signals are applied to one input of a mixer circuit. A local oscillator is connected to a second input of the mixer circuit. The mixer circuit then mixes or combines the RF signals with the local oscillator signal and produces output signals consisting RF frequency f1, local oscillator frequency f2, difference signal f2−f1, sum signal f2+f1, and other higher order products. A filter circuit is incorporated at the output terminal of the mixer to select the desired frequency signal and to reject other signals. A mixer circuit that produces the difference signal is generally known as a down converting mixer. A mixer circuit that produces the sum signal is generally is known as an up converting mixer. A down converter mixer is typically used in the receiver section of a communication device while an up converting mixer is utilized in the transmitter section of a two way communication device such a cell phone or wireless telephone. This difference or sum signal is referred to as the IF signal.

All known prior art circuits require a separate mixer and a separate controllable local oscillator, such as a voltage controlled oscillator. The local oscillator is then coupled to the mixer circuit by some matching circuit. The separate local oscillator, mixer, and matching circuitry require relatively large amounts of space. Because the mixer and local oscillator are separate circuits, the matching circuitry often requires discrete components (e.g., capacitors and/or inductors) which are difficult to provide and position in the circuit. Also, because the mixer and local oscillator are separate and require connecting and matching circuits, substantial loss occurs in the various signals. Further, in many instances some form of shielding or radiation separation/positioning must be used, to remove any possibility of interaction, other than the desired mixing.

Accordingly it is highly desirable to provide apparatus which overcomes the above described problems It is an object of the present invention to provide new and improved mixer circuitry which is much simpler and which requires substantially smaller space and fewer components.

BRIEF DESCRIPTION OF THE DRAWINGS

Referring to the drawings.

DESCRIPTION OF THE PREFERRED EMBODIMENT

Figure 1:
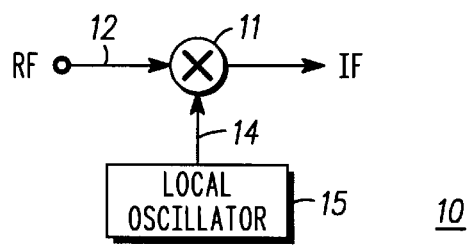
FIG. 1 is a simplified block diagram of prior art mixing circuitry.

Turning now to the figures, and specifically to FIG. 1, a simplified block diagram of prior art mixing circuitry 10 is illustrated. In the prior art, a mixer 11 receives radio frequency (RF) signals on a first input 12 and local oscillator signals on a second input 14 from a remotely located or separate local oscillator 15. Generally, the RF signals applied to input 12 are supplied from the front end of some type of communication device that receives the signals on an antenna and amplifies them in RF amplifiers (not shown). As is understood in the art the front end includes tuning and matching circuitry which is well understood and will not be explained in detail herein.

Local oscillator 15 is generally some type of voltage controlled oscillator (VCO) which is also tunable and which includes matching circuitry for communicating the local oscillator output to mixer 11 with the best efficiency. In many instances, the mixer includes devices such as field effect transistors (FETS) which require some additional matching circuitry, as is understood in the art. By providing separate mixer 11 and local oscillator 15 with matching circuitry therebetween, a large amount of space is required and substantial loss of signal occurs between the various components.

Figure 2:
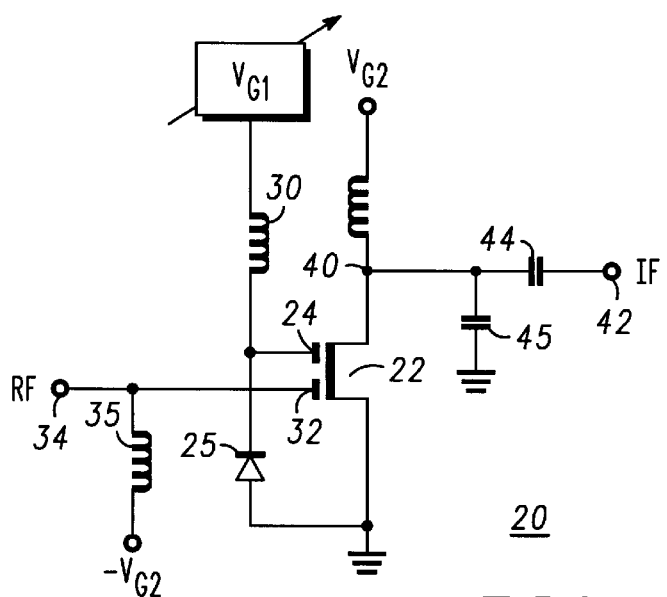
FIG. 2 is a schematic diagram of a self oscillating mixer circuit in accordance with the present invention.

Turning now to FIG. 2, a schematic diagram is illustrated of a self oscillating mixer circuit 20 in accordance with the present invention. Self oscillating mixer circuit 20 includes a transistor, which in this preferred embodiment is a dual gate field effect transistor (FET) 22. A first gate 24 of FET 22 is connected to one side of a negative differential resistance (NDR) device 25, the other side of which is connected to a common potential, such as ground.

Figure 3:
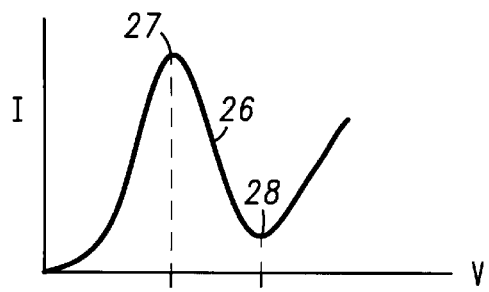
FIG. 3 illustrates a typical current-voltage characteristic for a negative differential resistance device.

NDR device 25 is generally a tunneling diode, such as a hetero-structure inter-band tunneling diode. A typical voltage-current (V-I) characteristic curve is illustrated in FIG. 3 for an NDR device of the type described herein. An NDR region 26 is positioned between points 27 and 28 on the characteristic curve. A bias voltage $V_{g1}$ is applied to first gate 24 and includes an adjustable feature. As a first adjustment, bias voltage $V_{g1}$ is adjusted so that NDR device 25 operates in NDR region 26 of its characteristic curve. When NDR device 25 is operating in NDR region 26, NDR device 25 and FET 22, together behave like an oscillator. Further, the frequency of the oscillations and the amplitude are controlled by bias voltage $V_{g1}$. That is, as bias voltage $V_{g1}$ is changed so that the operating point of NDR device 25 moves along NDR region 26, the frequency changes and as the amplitude of bias voltage $V_{g1}$ is changed the amplitude of the oscillations changes.

Generally a matching circuit is used to couple bias voltage. $V_{g1}$ to gate 24. In the present example, for instance, a coil 30 is positioned between bias voltage $V_{g1}$ and gate 24 to prevent the oscillations from being coupled to the source of bias voltage $V_{g1}$ while allowing the DC bias voltage to be applied to gate 24.

A second gate 32 of FET 22 is connected to receive radio frequency (RF) signals from an input terminal 34 and a second bias signal ($-V_{g2}$) supplied through a coil 35. It will be understood that some matching circuitry may be used to couple the RF signal to gate 32 and such matching circuitry may include, at least in part, coil 35. Coil 35 is positioned between bias voltage $-V_{g2}$ and input terminal 34 to prevent the RF signals from being coupled to the source of bias voltage $-V_{g2}$ while allowing the DC bias voltage to be applied to gate 32. While gate 24 is described first and gate 32 is described second for convenience in this description, generally, in the semiconductor industry the lower gate is referred to as a first gate and the upper gate is referred to as a second gate. However, it should be understood that the described circuitry will operate equally well if the connections to the gates are reversed. Thus, any reference to a first control terminal or a first gate applies to either gate 24 or 32 and any reference to a second control terminal or a second gate applies to either gate 32 or 24.

FET 22 includes an output terminal 40, which in this specific embodiment is the drain terminal of FET 22. Also, in this embodiment, the source terminal of FET 22 is connected directly to the common potential or ground so that NDR device 25 is connected from gate 24 to the source terminal of FET 22. A matching circuit couples the output signals from output terminal 40 to an intermediate frequency (IF) output terminal 42. The matching circuit includes, for example, a coupling capacitor 44 and a filter capacitor 45. Filter capacitor 45 is connected from output terminal 40 to the common potential or ground and is generally selected to pass all frequencies above the intermediate frequency. Coupling capacitor 44 is connected between output terminal 40 and IF terminal 44 and is selected to pass only the desired intermediate frequencies and to prevent the DC bias at terminal 40 from reaching IF output terminal 42.

Here it should be noted that FET 22 and NDR device 25, along with much of the matching circuitry can be easily integrated into a single device. Because many of the interconnections of the various components and/or terminals are automatically incorporated into the device, any losses due to interconnections are eliminated or substantially reduced. Further, because of the incorporation of FET 22 and NDR device 25, along with any interconnections, into a single integrated device, the amount of space required is substantially reduced. Also the cost of manufacturing can be substantially reduced, since the mixer and local oscillator are integrated into a single device, thereby substantially decreasing the die size.

In the operation of self oscillating mixer circuit 20, bias voltage $V_{g1}$ is adjusted or controlled so that NDR device 25 operates within NDR region 26 of its V-I characteristic curve. Under this condition, FET 22 and NDR device 25 together behave like an oscillator. Further, the oscillation frequency and amplitude are controlled by controlling bias voltage $V_{g1}$. An RF signal of a desired frequency is applied to gate 32 of FET 22 and the injected RF signal mixes with the oscillations to generate mixed product signals at output terminal 40. The output matching circuit then extracts the desired intermediate signal from the product signals and supplies it to IF output terminal 42.

Thus, new and improved mixer circuitry has been described which includes the mixer and local oscillator in a single integrated circuit. The new and novel mixer circuitry is much simpler to manufacture and requires substantially smaller space and fewer components. Further, because of the integration of the mixer and local oscillator into a single device, signal loss is greatly reduced.

An embodiment of the present invention in a down converter mixer application has been described. It should understood that the concept of this invention can be applied to an up converting mixer or any other frequency translating circuit and therefore this invention is not limited to the particular embodiment shown.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A self oscillating mixer circuit comprising:
   a transistor having a first control terminal, a second control terminal, and an output terminal;
   a negative differential resistance device coupled to the first control terminal;
   a first bias input circuit adapted to couple a first bias voltage across the negative differential resistance device; and
   a radio frequency input terminal and a second bias input circuit coupled to the second control terminal.

2. A self oscillating mixer circuit as claimed in claim 1 wherein the transistor is a dual gate field effect transistor with two input gate terminals, a drain terminal, and a source terminal.

3. A self oscillating mixer circuit as claimed in claim 2 wherein the output terminal of the transistor is the drain terminal of the dual gate field effect transistor, the source terminal is coupled to a common potential, and the negative differential resistance device is coupled between a first of the two input gate terminals and the common potential.

4. A self oscillating mixer circuit as claimed in claim 1 wherein the negative differential resistance device is a tunneling diode.

5. A self oscillating mixer circuit as claimed in claim 4 wherein the tunneling diode is a hetero-structure, inter-band tunneling diode.

6. A self oscillating mixer circuit as claimed in claim 1 wherein the radio frequency input terminal and the second bias input circuit include matching circuitry.

7. A self oscillating mixer circuit as claimed in claim 1 wherein the first bias input circuit is constructed to control operation of the negative differential resistance device within a negative differential resistance region of a voltage-current characteristic curve of the negative differential resistance device.

8. A self oscillating mixer circuit as claimed in claim 7 wherein the first bias input circuit is adjustable to adjust an applied first bias so as to control frequency and amplitude of oscillations.

9. A self oscillating mixer circuit as claimed in claim 1 wherein the second bias input circuit is constructed to bias the transistor approximately at maximum gain.

10. A self oscillating mixer circuit as claimed in claim 1 further including matching circuitry coupled to the output terminal of the transistor for extracting a desired intermediate frequency signal.

11. A self oscillating mixer circuit comprising:
    a field effect transistor having a first gate terminal, a second gate terminal, and an output terminal;
    a negative differential resistance device coupled to the first gate terminal;
    a first bias input circuit adapted to couple a first bias voltage across the negative differential resistance device, the first bias voltage controlling operation of the negative differential resistance device within a negative differential resistance region of a voltage-current characteristic curve of the negative differential resistance device so that oscillations occur in the negative differential resistance device and the field effect transistor; and
    a radio frequency input terminal and a second bias input circuit coupled to supply a second bias voltage at the second gate terminal, the second bias voltage biasing the field effect transistor approximately at maximum gain so that radio frequency signals applied to the radio frequency input terminal are mixed with the oscillations.

12. A self oscillating mixer circuit as claimed in claim 11 wherein the first bias input circuit is adjustable to adjust an applied first bias so as to control frequency and amplitude of oscillations.

13. A self oscillating mixer circuit as claimed in claim 11 wherein the negative differential resistance device is a tunneling diode.

14. A self oscillating mixer circuit as claimed in claim 13 wherein the tunneling diode is a heterostructure, inter-band tunneling diode.

15. A self oscillating mixer circuit as claimed in claim 11 wherein the radio frequency input terminal and the second bias input circuit include matching circuitry.

16. A self oscillating mixer circuit as claimed in claim 11 wherein mixed products of the radio frequency signals and the oscillations appear at the output terminal and further including matching circuitry coupled to the output terminal of the transistor for extracting a desired intermediate frequency signal from the mixed products.

17. A self oscillating mixer circuit comprising:
  a field effect transistor having a first gate terminal, a second gate terminal, and an output terminal;
  a negative differential resistance tunneling diode coupled to the first gate terminal;
  a first bias input circuit adapted to couple a first bias voltage across the negative differential resistance tunneling diode, the first bias voltage controlling operation of the negative differential resistance a tunneling diode within a negative differential resistance region of a voltage-current characteristic curve of the negative differential resistance a tunneling diode so that oscillations occur in the negative differential resistance a tunneling diode and the field effect transistor, and the first bias input circuit being adjustable to adjust the applied first bias voltage so as to control frequency and amplitude of the oscillations; and
  a radio frequency input terminal and a second bias input circuit coupled to supply a second bias voltage at the second gate terminal, the second bias voltage biasing the field effect transistor approximately at maximum gain so that radio frequency signals applied to the radio frequency input terminal are mixed with the oscillations.

18. A self oscillating mixer circuit as claimed in claim 17 wherein the negative differential resistance is a heterostructure, inter-band tunneling diode.

* * * * *

UNITED STATES PATENT AND TRADEMARK OFFICE
CERTIFICATE OF CORRECTION

PATENT NO. : 6,594,478 B1
DATED : July 15, 2003
INVENTOR(S) : Nair et al.

It is certified that error appears in the above-identified patent and that said Letters Patent is hereby corrected as shown below:

Column 6,
Line 24, after "differential resistance" insert -- tunneling diode --.

Signed and Sealed this

Fourth Day of May, 2004

JON W. DUDAS
*Acting Director of the United States Patent and Trademark Office*